(12) United States Patent
Kim

(10) Patent No.: US 6,891,771 B2
(45) Date of Patent: May 10, 2005

(54) CIRCUIT AND METHOD FOR SELECTING AN OPERATIONAL VOLTAGE MODE IN A SEMICONDUCTOR MEMORY DEVICE

(75) Inventor: Jae-Hoon Kim, Kyunggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/456,169

(22) Filed: Jun. 4, 2003

(65) Prior Publication Data
US 2004/0004895 A1 Jan. 8, 2004

(30) Foreign Application Priority Data
Jul. 4, 2002 (KR) ......................................... 2002-38574

(51) Int. Cl.[7] ................................................ G11C 7/14
(52) U.S. Cl. .................... 365/226; 365/227; 365/189.09
(58) Field of Search .......................... 365/185.23, 233, 365/226, 185.18, 211, 212

(56) References Cited

U.S. PATENT DOCUMENTS

| | | | | |
|---|---|---|---|---|
| 5,363,335 A | * | 11/1994 | Jungroth et al. ............. | 365/226 |
| 5,440,520 A | | 8/1995 | Schutz et al. | |
| 5,615,151 A | * | 3/1997 | Furuno et al. .......... | 365/185.18 |
| 5,889,719 A | * | 3/1999 | Yoo et al. .................... | 365/226 |
| 6,101,127 A | | 8/2000 | Rolandi | |
| 6,366,521 B1 | * | 4/2002 | Roohparvar ................. | 365/226 |
| 2002/0073346 A1 | * | 6/2002 | Yu et al. ...................... | 713/300 |
| 2003/0179010 A1 | * | 9/2003 | Gerstmeier et al. ............ | 326/37 |
| 2004/0174763 A1 | * | 9/2004 | Schnepper ................... | 365/226 |

* cited by examiner

Primary Examiner—Richard Elms
Assistant Examiner—Dang T Nguyen
(74) Attorney, Agent, or Firm—Marger, Johnson & McCollom, P.C.

(57) ABSTRACT

A technique for selecting a desired operational voltage mode in a semiconductor memory device by applying an external command signal is disclosed. The technique enables an internal voltage mode to be selected in response to an internal voltage mode selection that is programmable even after the completion of the package process for a semiconductor memory device. In one embodiment, the operational voltage mode selection circuit of a semiconductor memory device includes a first selection signal generating part that allows programmable selection of, or override of, a first operational voltage mode; a second selection signal generating part that allows programmable selection of, or override of, a second operational voltage mode; and an operational voltage mode determining part for decoding the output of the first and second voltage selection signal generating parts, along with programmable input selection signals, output an operational voltage mode determining signal.

21 Claims, 3 Drawing Sheets

CIRCUIT AND METHOD FOR SELECTING AN OPERATIONAL VOLTAGE MODE IN A SEMICONDUCTOR MEMORY DEVICE

TECHNICAL FIELD OF THE INVENTION

The present invention relates to an operational voltage mode selecting circuit for a semiconductor memory device and method thereof. More particularly, the present invention relates to an operational voltage mode selecting circuit and method for selecting an operational voltage as desired, with an external input signal, in a semiconductor memory device.

BACKGROUND

Generally, a semiconductor package is made by bonding wires from signal input/output terminals in a lead frame to corresponding input/output pads on a semiconductor chip, and molding the semiconductor chip and lead frame within package means. Accordingly, single devices and integrated circuits on a semiconductor substrate may be protected from environmental factors such as dust, moisture, electrical and mechanical loads, and the performance of the semiconductor chip may be optimized or maximized.

When semiconductor devices are packaged in such a manner, input selector mode pads are selectively bonded or not bonded (connected) to a ground voltage so that a mode is set during packaging. Since input pads receive signals at external voltage levels, buffers may be necessary to convert the external signal levels to logic signals at the chip's internal voltage levels. In a case where there is a plurality of selectable structures, selectable parameters are input through two or more pads. These parameters are decoded, thereby selecting one out of the plurality of structures, by a bonding option circuit.

FIG. 1 is a block diagram illustrating a connection structure between conventional pads and a bonding option circuit. One out of the 3.3 V mode selection pad 10, 2.5 V mode selection pad 12, and 1.8 V mode selection pad 14 is connected (bonded) to a lead frame and the others are not connected to the lead frame.

The bonding option circuit 16 is connected to the 3.3 V mode selection pad 10 and the 1.8 V mode selection pad 14. In this case, when the 3.3 V mode selection pad 10 is connected to the lead frame, the 3.3V mode selection pad 10 receives a logic high signal and the 1.8 V mode selection pad 14 receives no input signal. When the 1.8 V mode selection pad 14 is connected to the lead frame, the 1.8 V mode selection pad 14 receives a logic high signal and the 3.3 V mode selection pad 10 receives no input signal. When the 2.5 V mode selection pad 12 is connected to the lead frame, the bonding option circuit 16 does not receive a logic high signal because it is not connected to pad 12. At this time, the 3.3V mode selection pad 10 and the 1.8 V mode selection pad 14 receive no input signal. Accordingly, the bonding option circuit 16 allows the internal circuit 18 to operate with a selected internal voltage mode output of the 3.3 V mode, 2.5 V mode and 1.8 V mode, according to a signal input to a bonding pad out of the 3.3V mode selection pad 10, the 2.5 V mode selection pad 12, and the 1.8V mode selection pad 14.

FIG. 2 is a circuit diagram of a conventional bonding option circuit.

In a case where the 3.3 V mode selection pad 10 (FIG. 1) is bonded to the lead frame, the 3.3 V mode selection signal is a high signal and the 1.8 V mode selection signal is pulled low by NMOS transistors 30, 32. The 3.3 V mode selection signal is inverted through inverters 24, 26, 28 and output as a low signal, which is input to an input terminal of NAND gate 40. The 1.8 V mode selection signal is inverted through inverters 34, 36, 38 and output as a high signal, which is input to the other input terminal of NAND gate 40. NAND gate 40 NANDs the low and high signals that are input respectively to its two input terminals, thereby generating a high output signal. The high signal output from NAND gate 40 is inverted through inverter 42 to output a low signal. The low signal output from inverter 42 is input to a 2.5 V mode selection terminal of the internal circuit 18. The low signal output from inverter 28 and the low signal output from inverter 42 are input to NOR gate 44. NOR gate 44 NORs its two input signals and outputs a high signal, which is input to a 3.3 V mode selection terminal of the internal circuit 18.

In addition, the high signal output from inverter 38 and the low signal output from inverter 42 are input to NOR gate 46. NOR gate 46 NORs the two input signals and outputs a low signal to a 1.8 V selection terminal. Accordingly, the internal circuit 18 has a high signal input to the 3.3V mode selection terminal, and operates in a 3.3 V mode.

In a case where the 1.8 V mode selection pad 14 (FIG. 1) is bonded to the lead frame 11, the 1.8 V mode selection signal is a high signal and the 3.3 V mode selection signal is pulled low by NMOS transistors 20, 22. The 3.3 V mode selection signal is inverted through inverters 24, 26, 28 and output as a high signal, which is input to an input terminal of NAND gate 40. The 1.8 V mode selection signal is inverted inverted through inverters 34, 36, 38 and output as a low signal, which is input to the other input terminal of NAND gate 40. NAND gate 40 NANDs the high and low signals that are input respectively to its two input terminals, thereby generating a high output signal. The high signal output from NAND gate 40 is inverted through inverter 42 to output a low signal. The low signal output from inverter 42 is input to the 2.5 V mode selection terminal of the internal circuit 18. The high signal output from inverter 28 and the low signal output from inverter 42 are input to NOR gate 44. NOR gate 44 NORs its two input signals and outputs a low signal, which is input to the 3.3 V mode selection terminal of the internal circuit 18.

In addition, the low signal output from inverter 38 and the low signal output from inverter 42 are input to NOR gate 46. NOR gate 46 NORs the two input signals and outputs a high signal to the 1.8 V mode selection terminal. Accordingly, the internal circuit 18 has a high signal input to the 1.8V mode selection terminal, and operates in a 1.8 V mode.

In a case where the 3.3 V mode selection pad 10 and the 1.8 V mode selection pad 14 (FIG. 1) both are not bonded to the lead frame, the 2.5 V mode is selected. In this case, the 1.8 V mode selection signal and the 3.3 V mode selection signal are both pulled low. The 3.3 V mode selection signal is inverted through inverters 24, 26, 28 and output as a high signal, which is input to an input terminal of NAND gate 40. The 1.8 V mode selection signal is through inverters 34, 36, 38 and output as a high signal, which is input to the other input terminal of NAND gate 40. NAND gate 40 NANDs the high signals that are input to its two input terminals, thereby generating a low output signal. The low signal output from NAND gate 40 is inverted through inverter 42 to output a high signal. The high signal output from inverter 42 is input to the 2.5 V mode selection terminal of the internal circuit 18.

The high signal output from the inverter 28 and the high signal output from inverter 42 are input to NOR gate 44.

NOR gate 44 NORs its two input signals and outputs a low signal, which is input to the 3.3 V mode selection terminal of the internal circuit 18.

In addition, the high signal output from inverter 38 and the high signal output from inverter 42 are input to NOR gate 46. NOR gate 46 NORs the two input signals and outputs a low signal to the 1.8 V selection terminal. Accordingly, the internal circuit 18 has a high signal input to the 2.5V mode selection terminal, and operates in a 2.5 V mode.

Once the bonding option circuit as described above is bonded and packaged, the circuit operates only at the internal voltage mode that is bonded therein. Thus, the internal circuit cannot be changed to other internal voltage modes, nor can it be tested at the other internal voltage modes.

SUMMARY OF THE INVENTION

It is an object of the present invention to provide an operational voltage mode selection circuit and corresponding method, wherein internal voltage modes may be selected according to an internal voltage mode selection that is programmable even after package processing is completed for a semiconductor memory device.

It is another object of the present invention to provide an operational voltage mode selection circuit and corresponding method, wherein an internal circuit may be tested by changing internal voltage modes after package processing is completed for a semiconductor memory device.

In accordance with one aspect of the present invention, an operational voltage mode selection circuit of a semiconductor memory device comprises default voltage mode logic to set a default operational voltage mode based on the packaged state of the semiconductor memory device, and override voltage mode logic capable of setting an operational voltage mode different from the default operational voltage mode based on a memory device input signal.

In accordance with another aspect of the present invention, an operational voltage mode selection method for a semiconductor memory device comprises selectively determining one operational voltage mode out of a plurality of operational voltage modes in response to an operational voltage mode selection signal input to the device after the semiconductor memory device is package.d In accordance with another aspect of the present invention, an operational voltage mode selection method for a semiconductor memory device comprises the steps of generating a first selection signal and a second selection signal for determining an operational mode in response to first and second operational voltage mode selection signals input to the device after the semiconductor memory device is packaged, and decoding the first and second selection signals and the operational mode selection signals to thereafter determine an operational voltage mode.

These and other aspects, features, and advantages of the present invention will be described and become apparent by the detailed description of preferred embodiments, which is to be read in connection with the accompanying figures.

DETAILED DESCRIPTION OF PREFERRED EMBODIMENTS

Figure 1:
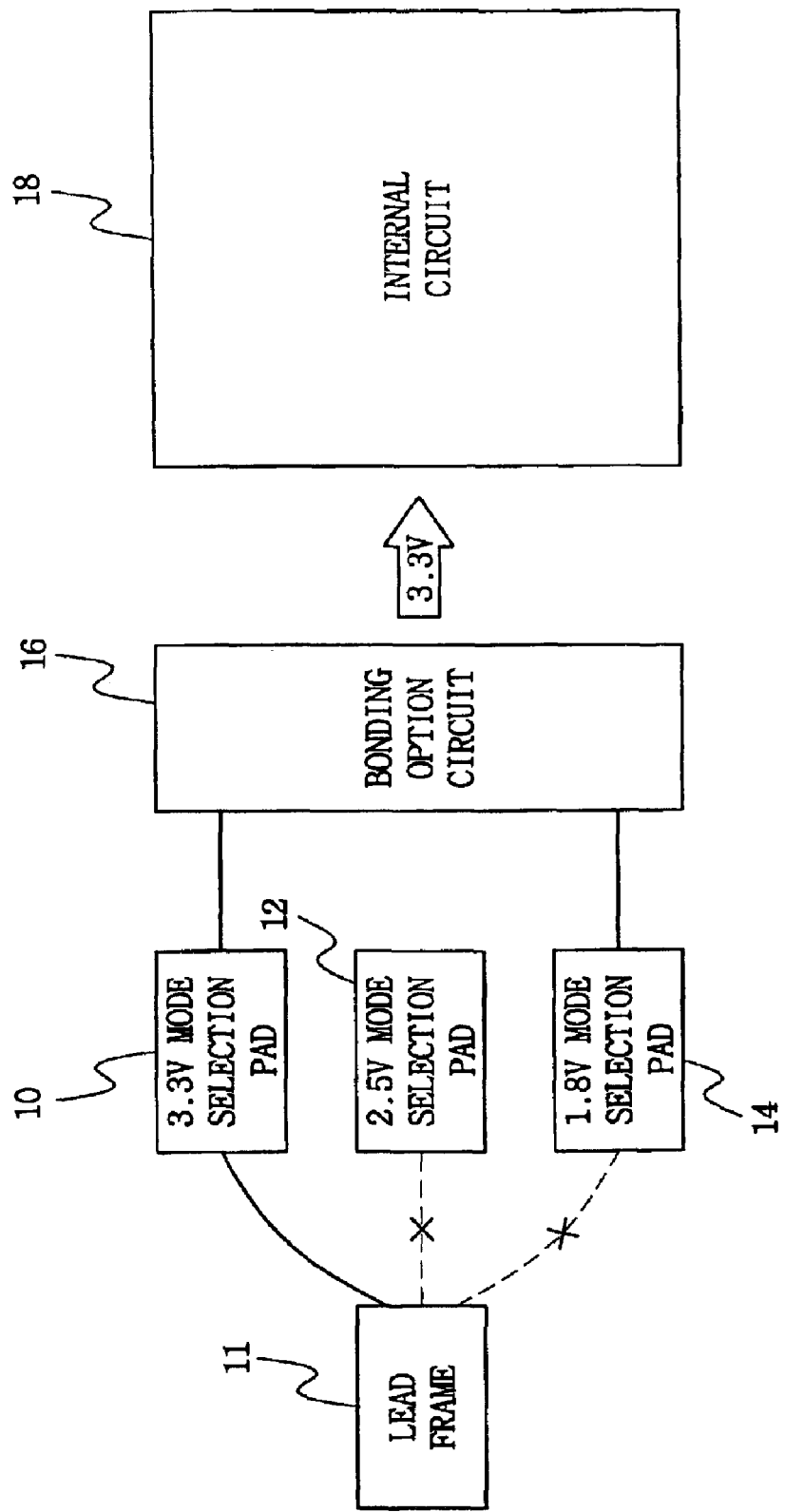
FIG. 1 shows a block diagram illustrating connection relationships between pads and a bonding option circuit according to the prior art.
Figure 2:
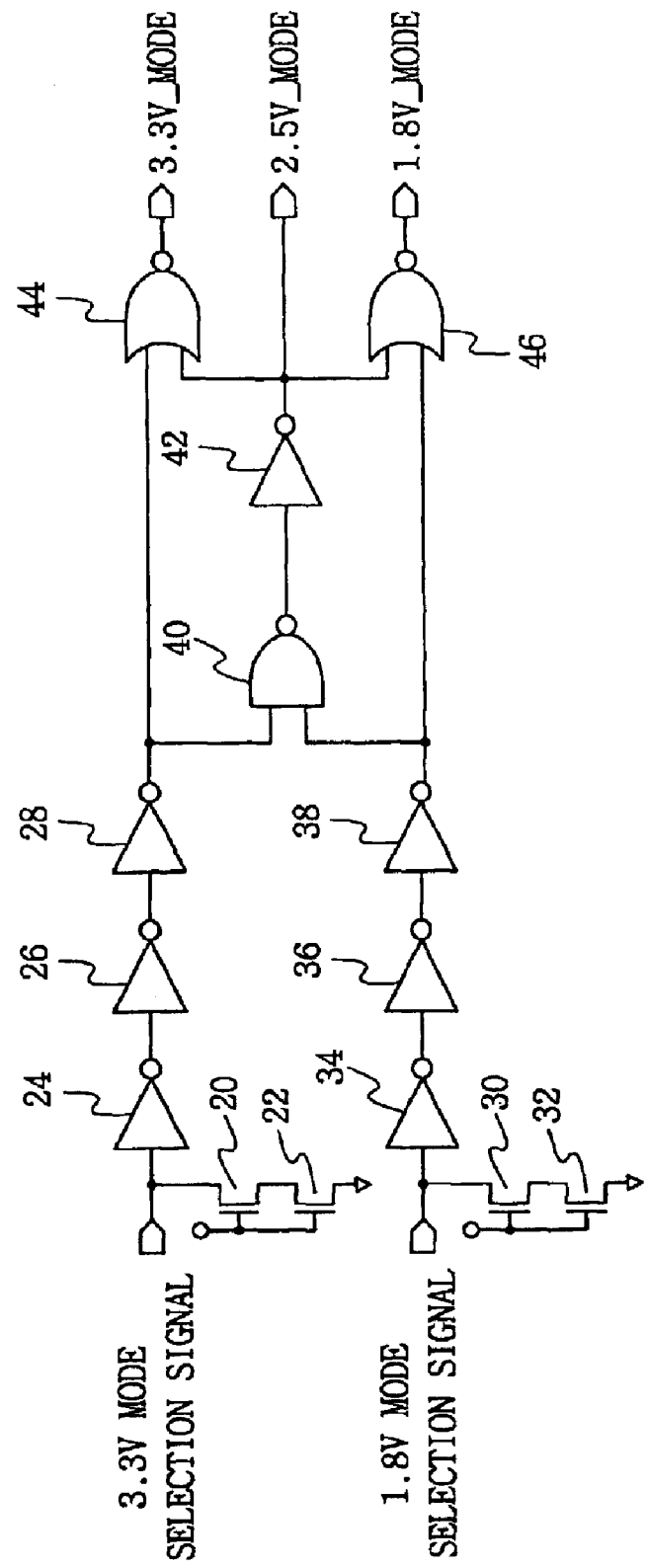
FIG. 2 depicts a circuit diagram of a conventional bonding option circuit.

Preferred embodiments of the present invention will now be described in detail with reference to the accompanying drawings, where like reference numerals and symbols are used to denote like or equivalent parts or portions. For simplicity of illustration and explanation, detailed descriptions of known features and functions will be omitted.

Figure 3:
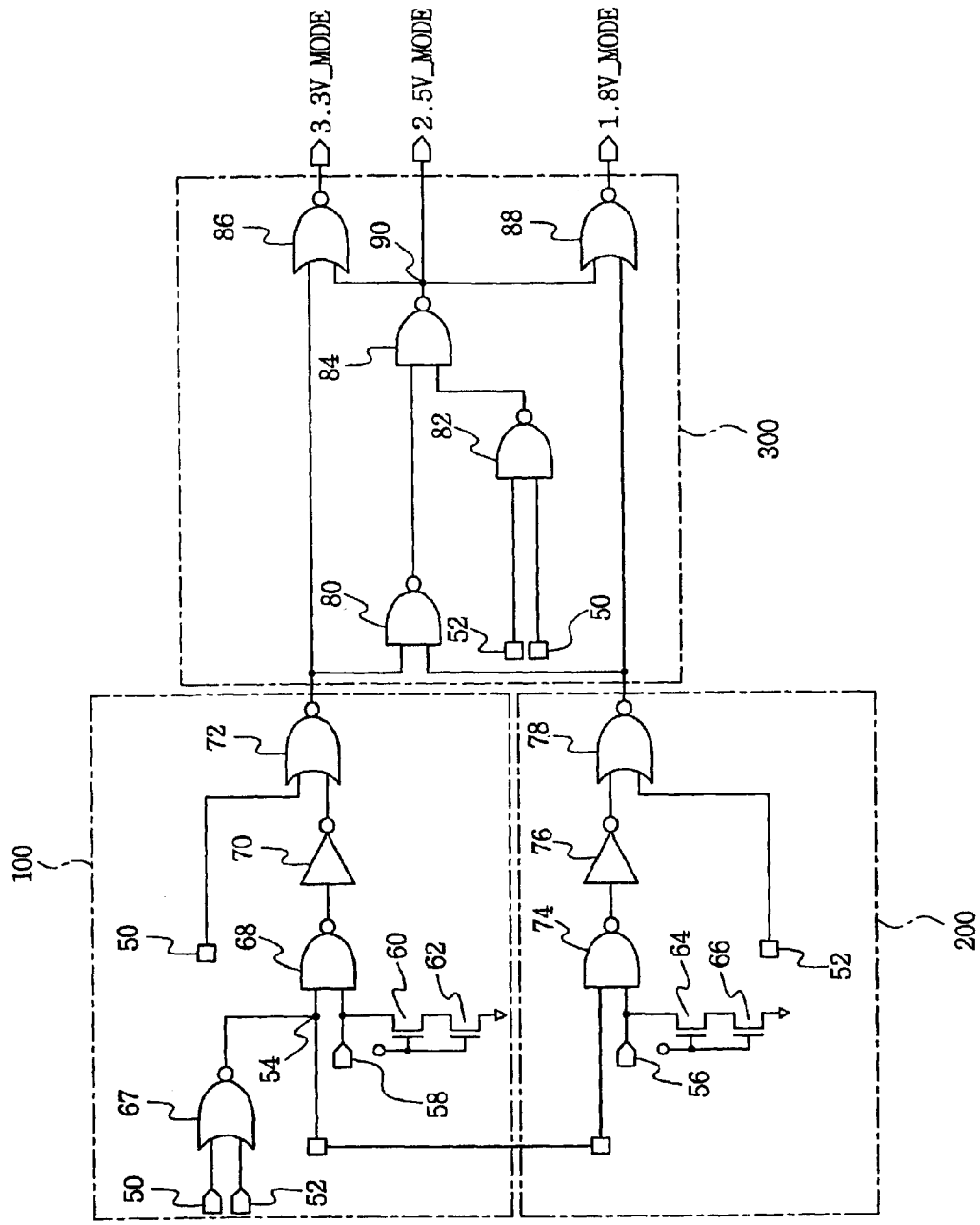
FIG. 3 illustrates a circuit diagram for a bonding option circuit according to an embodiment of the present invention.

FIG. 3 depicts a circuit diagram for an option pad bonding circuit according to an embodiment of the present invention, for use in a semiconductor memory device.

The Option pad bonding circuit comprises a first selection signal generating part 100, a second selection signal generating part 200, and an operational voltage mode determining part 300. The first selection signal generating part 100 comprises a pull down circuit 60, 62, a NOR gate 67, a NAND gate 68, an inverter 70 and a NOR gate 72. The second selection signal generating part 200 comprises a pulldown circuit 64, 66, a NAND gate 74, an inverter 76 and a NOR gate 78. The operational voltage mode determining part 300 comprises three NAND gates 80, 82, 84 and two NOR gates 86, 88.

The operational voltage modes output by operational voltage mode determining part 300 comprise, for instance, a 3.3 V mode, a 2.5 V mode and a 1.8 V mode. The first operational voltage mode asserts a 3.3 V voltage mode selection signal, and the second operational voltage mode asserts a 1.8 V voltage mode selection signal. When the first and second operational voltage mode selection signals are not selected, this case operates to select a third operational voltage mode. The third operational voltage mode asserts a 2.5 V voltage mode selection signal.

In more detail, the first selection signal generating part 100 accepts three input signals, respectively, at terminals 50, 52, and 58. In this example, terminal 50 is assumed to be connected to a first mode register set (MRS) output representing a 3.3 V voltage mode selection signal, terminal 52 is assumed to be connected to a second MRS output representing a 1.8 V voltage mode selection signal, and terminal 58 is assumed to be connected to a 3.3 V mode selection input pad.

NOR gate 67 has its input terminals connected to terminals 50 and 52, and its output terminal connects to node 54. Accordingly, when either one or both of the mode register set outputs (3.3 V and 1.8 V voltage mode selection signals, respectively) is asserted high, node 54 is low. Node 54 is only high when neither mode register set output is asserted high.

NAND gate 68 has its input terminals connected, respectively, to node 54 and terminal 58. Thus when NOR gate 67 drives node 54 low (meaning at least one of the two MRS outputs is high), the input signal at terminal 58 cannot affect the output of the first selection signal generating part 100. When node 54 is high, the output of NAND gate 68 depends on whether a 3.3 V mode selection input pad (connected to terminal 58) is bonded to the lead frame or not: when bonded, terminal 58 is high and the output of NAND gate 68 is driven low; when not bonded, pull-down circuit 60, 62 pulls terminal 58 low and the output of NAND gate 68 stays high.

Inverter 70 inverts the output of NAND gate 68 and supplies the inverted output to one input of NOR gate 72. The other input of NOR gate 72 is connected to terminal 50

(the 3.3 V voltage mode MRS output). The output of the first selection signal generating part 100 is taken at the output of NOR gate 72. Accordingly, generating part 100 outputs a low signal whenever terminal 50 is high, or when terminal 58 is high and neither terminal 50 nor terminal 52 is high. In other words, selecting either a 3.3 V bonding option and no MRS voltage option, or setting a 3.3 V MRS option, will result in a low output from first selection signal generating part 100.

Continuing with the detailed description, the second selection signal generating part 200 accepts two input signals, respectively, at terminals 52 and 56, as well as the signal generated by NOR gate 67 at node 54. In this example, terminal 52 is assumed to be connected to the second MRS output representing a 1.8 V voltage mode selection signal, and terminal 56 is assumed to be connected to a 1.8 V mode selection input pad.

NAND gate 74 has its input terminals connected, respectively, to node 54 and terminal 56. Thus when NOR gate 67 drives node 54 low (meaning at least one of the two MRS outputs is high), the input signal at terminal 56 cannot affect the output of the second selection signal generating part 200. When node 54 is high, the output of NAND gate 74 depends on whether a 1.8 V mode selection input pad (connected to terminal 56) is bonded to the lead frame or not: when bonded, terminal 56 is high and the output of NAND gate 74 is driven low; when not bonded, pull-down circuit 64, 66 pulls terminal 56 low and the output of NAND gate 74 stays high.

Inverter 76 inverts the output of NAND gate 74 and supplies the inverted output to one input of NOR gate 78. The other input of NOR gate 78 is connected to terminal 52 (the 1.8 V voltage mode MRS output). The output of the second selection signal generating part 200 is taken at the output of NOR gate 78. Accordingly, generating part 200 outputs a low signal whenever terminal 52 is high, or when terminal 56 is high and neither terminal 50 nor terminal 52 is high. In other words, selecting either a 1.8 V bonding option and no MRS voltage option, or setting a 1.8 V MRS option, will result in a low output from second selection signal generating part 200.

The detailed operation of operational voltage mode determining part 300 is as follows. The outputs of both first selection signal generating part 100 and second selection signal generating part 200 are input to NAND gate 80. Accordingly, NAND gate 80 always outputs a high signal unless both selection signal generating parts are outputting high signals (signifying neither is trying to select an operational voltage).

NAND gate 82 accepts its input from terminals 50 and 52 (the 3.3 V and 1.8 V voltage mode MRS outputs, respectively). Accordingly, NAND gate 82 always outputs a high signal unless both of the MRS outputs are high (a condition that signifies that the MRS outputs are trying to set a 2.5 V voltage mode).

NAND gate 84 accepts as its input the outputs of NAND gates 80 and 82, and outputs a 2.5 V voltage mode selection signal at node 90. This signal is asserted high (selecting the 2.5 V voltage mode) whenever one of the outputs of NAND gates 80 and 82 is low. Thus if either both MRS outputs are high, or both MRS outputs are low and both voltage mode selection input pads (terminals 56 and 58) are not connected to the lead frame, the 2.5 V voltage mode is selected.

The 3.3 V voltage mode selection signal is output from operational voltage mode determining part 300 at the output of NOR gate 86. NOR gate 86 accepts at its input the output of first selection signal generating part 100 and the 2.5 V voltage mode selection signal from node 90. Accordingly, any time that the 2.5 V voltage mode selection signal is asserted high, the 3.3 V voltage mode selection signal will be forced low. And any time that the 2.5 V voltage mode selection signal is low, the 3.3 V voltage mode selection signal will be the inverse of the output of first selection signal generating part 100. In other words, the 3.3 V voltage mode selection signal will be asserted from the MRS registers when terminal 50 is high and terminal 52 is low, or from the bonding option pads when terminal 58 is high and terminal 56 is low, and the MRS registers are low.

The 1.8 V voltage mode selection signal is output from operational voltage mode determining part 300 at the output of NOR gate 88. NOR gate 88 accepts at its input the output of second selection signal generating part 200 and the 2.5 V voltage mode selection signal from node 90. Accordingly, any time that the 2.5 V voltage mode selection signal is asserted high, the 1.8 V voltage mode selection signal will be forced low. And any time that the 2.5 V voltage mode selection signal is low, the 1.8 V voltage mode selection signal will be the inverse of the output of second selection signal generating part 200. In other words, the 1.8 V voltage mode selection signal will be asserted from the MRS registers when terminal 52 is high and terminal 50 is low, or from the bonding option-pads when terminal 56 is high and terminal 58 is low, and the MRS registers are low.

In summary, according to this embodiment one of three voltage modes can be preset by a bonding option, but this default voltage can be overridden by application of an appropriate signal pair to two mode register set registers, regardless of which bonding option pad is bonded to the lead frame.

In the embodiments of the present invention as described above, bonding option circuits are used in order to select an operational voltage mode. Fuse option circuits may be used, e.g., to select a default operational voltage mode in an alternate embodiment.

Although illustrative embodiments of the present invention have been described with reference to the accompanying drawings, it is to be understood that the invention is not limited to those precise embodiments, and various other changes and modifications may be effected therein by one skilled in the art without departing from the scope or spirit of the invention as defined in the appended claims.

What is claimed is:

1. An operational voltage mode selection circuit for a semiconductor memory device, the circuit comprising:
   default voltage mode logic to set a default operational voltage mode based on the packaged state of the semiconductor memory device; and
   override voltage mode logic capable of setting an operational voltage mode different from the default operational voltage mode based on a memory device input signal.

2. The operational voltage mode selection circuit of claim 1, wherein the packaged state referred to by the default voltage mode logic is capable of different configurations that result in different default operational voltage modes, and wherein the packaged state is selected from the group of packaged states comprising a packaged state set by a bonding option pad connection configuration, a packaged state set by a fuse burn/intact configuration, and combinations thereof.

3. The operational voltage mode selection circuit of claim 1, wherein the memory device input signal comprises at least one input signal to program a programmable mode register that supplies a register value to the override voltage mode logic.

4. The operational voltage mode selection circuit of claim 1, having at least three selectable operational voltage modes, and wherein the default voltage mode logic and override voltage mode logic are distributed among:

a first selection signal generating part capable of generating and asserting a first selection signal
when a first programmable operational voltage selection signal is asserted, and
when a first package default operational voltage selection signal is asserted and no programmable operational voltage selection signal is asserted;

a second selection signal generating part capable of generating and asserting a second selection signal
when a second programmable operational voltage selection signal is asserted, and
when a second package default operational voltage selection signal is asserted and no programmable operational voltage selection signal is asserted; and an operational voltage mode determining part capable of generating and asserting an operational voltage mode determining signal based on the first and second selection signals and the first and second programmable operational voltage selection signals.

5. The operational voltage mode selection circuit of claim 4, the operational voltage mode determining part comprising:

first digital logic to set a first operational voltage mode
when the first and second programmable operational voltage selection signals and the first and second selection signals are all asserted, and
when the first and second programmable operational voltage selection signals and the first and second selection signals are all deasserted;

second digital logic to set a second operational voltage mode when the first selection signal is asserted and the first operational voltage mode is not set; and third digital logic to set a third operational voltage mode when the second selection signal is asserted and the first operational voltage mode is not set.

6. The operational voltage mode selection circuit of claim 5, wherein the first and second selection signals are asserted at a low logic level.

7. The operational voltage mode selection circuit of claim 5, wherein the first, second, and third operational voltage modes correspond respectively to a 2.5 V mode, a 3.3 V mode, and a 1.8 V mode.

8. An operational voltage mode selection method for a semiconductor memory device comprising:

selectively determining one operational voltage mode out of a plurality of operational voltage modes in response to an operational voltage mode selection signal input to the device after a default operational voltage mode is set by the packaged state of the semiconductor memory device.

9. The operational voltage mode selection method as claimed in claim 8, wherein the operational voltage mode comprises first, second and third operational voltage modes.

10. The operational voltage mode selection method as claimed in claim 9, wherein the first, second and third operational voltage modes correspond to a 3.3 V mode, a 2.5 V mode and a 1.8 V mode, respectively.

11. The operational voltage mode selection method as claimed in claim 10, wherein the operational voltage mode determining method comprises determining a 3.3 V voltage mode when a first operational voltage mode selection signal is input.

12. The operational voltage mode selection method as claimed in claim 10, wherein the operational voltage mode determining method comprises determining a 1.8 V voltage mode when a second operational voltage mode selection signal is input.

13. The operational voltage mode selection method as claimed in claim 10, wherein the operational voltage mode determining method comprises determining a 2.5 V voltage mode when the first and second operational voltage mode selection signals are both input.

14. The operational voltage mode selection method as claimed in claim 8, wherein the first and second operational voltage mode selection signals are input to the device through first and second mode register set terminals.

15. An operational voltage mode selection method for a semiconductor memory device comprising the steps of:

generating a first selection signal and a second selection signal for determining an operational mode, in response to first and second operational voltage mode selection signals input to the device after a default operational voltage mode is set by the packaged state of the semiconductor memory device; and decoding the first and second selection signals and the operational mode selection signals to thereafter determine an operational voltage mode.

16. The operational voltage mode selection method as claimed in claim 15, having first, second, and third operational voltage modes.

17. The operational voltage mode selection method as claimed in claim 16, wherein the first, second and third operational voltage modes correspond to a 3.3 V mode, a 2.5 V mode and a 1.8 V mode, respectively.

18. The operational voltage mode selection method as claimed in claim 17, wherein the operational voltage mode determining step comprises determining a 3.3 V voltage mode when the first operational voltage mode selecting signal is asserted.

19. The operational voltage mode selection method as claimed in claim 17, wherein the operational voltage mode determining step comprises determining a 1.8 V voltage mode when the second operational voltage mode selection signal is asserted.

20. The operational voltage mode selection method as claimed in claim 17, wherein the operational voltage mode determining step comprises determining a 2.5 V voltage mode when the first and second operational voltage mode selection signals are both asserted.

21. The operational voltage mode selection method as claimed in claim 20, wherein the first and second operational voltage mode selection signals are input to the device through first and second mode register set terminals.

* * * * *